(12) United States Patent
Amano et al.

(10) Patent No.: US 8,558,362 B2
(45) Date of Patent: Oct. 15, 2013

(54) SEMICONDUCTOR DEVICE AND MANUFACTURING METHOD OF THE SAME

(75) Inventors: Kenji Amano, Nanae (JP); Hajime Hasebe, Nanae (JP)

(73) Assignee: Renesas Electronics Corporation, Kanagawa (JP)

( * ) Notice: Subject to any disclaimer, the term of this patent is extended or adjusted under 35 U.S.C. 154(b) by 573 days.

(21) Appl. No.: 12/147,676

(22) Filed: Jun. 27, 2008

(65) Prior Publication Data
US 2009/0079051 A1    Mar. 26, 2009

(30) Foreign Application Priority Data

Sep. 20, 2007 (JP) .................................. 2007-243944

(51) Int. Cl.
*H01L 23/495* (2006.01)
(52) U.S. Cl.
USPC .................. 257/676; 257/678; 257/E21.499; 438/123
(58) Field of Classification Search
USPC .......... 257/666, 696, 787, 667–684, E21.499; 438/123
See application file for complete search history.

(56) References Cited

U.S. PATENT DOCUMENTS

| | | | |
|---|---|---|---|
| 5,378,656 A | 1/1995 | Kajihara et al. | |
| 6,208,020 B1 | 3/2001 | Minamio et al. | |
| 6,642,609 B1 * | 11/2003 | Minamio et al. | 257/666 |
| 6,713,849 B2 * | 3/2004 | Hasebe et al. | 257/667 |
| 6,720,207 B2 | 4/2004 | Minamio et al. | |
| 6,909,168 B2 | 6/2005 | Minamio et al. | |
| 6,967,396 B1 * | 11/2005 | Shibata | 257/684 |
| 7,227,245 B1 * | 6/2007 | Bayan et al. | 257/666 |
| 2002/0121650 A1 * | 9/2002 | Minamio et al. | 257/200 |
| 2005/0167855 A1 * | 8/2005 | Minamio et al. | 257/787 |
| 2007/0063320 A1 | 3/2007 | Punzalan et al. | |

FOREIGN PATENT DOCUMENTS

| | | |
|---|---|---|
| JP | 6-216303 | 8/1994 |
| JP | 2000-243891 | 9/2000 |
| JP | 2002-246529 A | 8/2002 |
| JP | 2002-261187 A | 9/2002 |
| JP | 2003-37219 | 2/2003 |
| JP | 2003-124421 | 4/2003 |
| JP | 2005-166943 | 6/2005 |
| JP | 2005-294443 | 10/2005 |

OTHER PUBLICATIONS

Chinese Office Action dated Aug. 1, 2012.
JP Office Action in JP Application No. 2007-243944, dated Oct. 2, 2012.

* cited by examiner

*Primary Examiner* — Eugene Lee
*Assistant Examiner* — Fang-Xing Jiang
(74) *Attorney, Agent, or Firm* — Mattingly & Malur, PC

(57) ABSTRACT

The outflow of die bond material is prevented and the quality and reliability of a semiconductor device are improved. A tab, a plurality of leads arranged around the tab, silver paste arranged on a chip supporting surface of the tab, and a semiconductor chip mounted via silver paste on the tab are included. Further, a plurality of wires which electrically connect a pad of the semiconductor chip, a lead, and a sealing body which does the resin seal of the semiconductor chip and the wires are also included. By forming a step part whose height is lower than the chip supporting surface at an edge part of the chip supporting surface of the tab, the silver paste protruded from the tab can be stopped at the step part. As a result, an outflow to the back surface of the sealing body of silver paste can be prevented.

3 Claims, 20 Drawing Sheets

SEMICONDUCTOR DEVICE AND MANUFACTURING METHOD OF THE SAME

CROSS-REFERENCE TO RELATED APPLICATION

The present application claims priority from Japanese patent application No. 2007-243944 filed on Sep. 20, 2007, the content of which is hereby incorporated by reference into this application.

FIELD OF THE INVENTION

The present invention relates to a semiconductor device and its manufacturing technology, and particularly relates to an effective technology for application to a semiconductor device in which the tab (chip mounting part) is exposed.

DESCRIPTION OF THE BACKGROUND ART

There is technology which enlarges the adhesion area of a semiconductor chip and resin by making the outline dimension of a die pad smaller than the outline dimension of the semiconductor chip mounted on it, and enabling mounting of various semiconductor chips with differing outline dimensions on a die pad by cutting the tip of the lead to a proper length according to the outline dimension of the semiconductor chip (for example, refer to Patent Reference 1).

There is technology making it possible to choose the size of a semiconductor chip freely, without causing interference with a suspension lead by forming a half-cut section in a die pad, and doing the offsetting of the central part rather than the periphery in a QFN whose external terminal is projected below (for example, refer to Patent Reference 2).

[Patent Reference 1] Japanese patent laid-open No. Hei 6 (1994)-216303
[Patent Reference 2] Japanese patent laid-open No. 2000-243891

SUMMARY OF THE INVENTION

In a semiconductor device of a non-lead type, such as a QFN (Quad Flat Non-leaded Package), a part of each lead is arranged to expose the edge part of the back surface of the sealing body, and these constitute an external terminal. In such a QFN, a semiconductor device which brings chip size close to package size as much as possible is demanded in connection with further miniaturization and thickness reduction. Since semiconductor devices in recent years have tended to have advanced features, the quantity of heat generated from the semiconductor chips has also become large. Therefore, when the reliability of a semiconductor device is taken into consideration, improvement in the heat radiation property is also required. In addition to these requirements, it is necessary to suppress the increase in the manufacturing cost.

In order to meet these requirements, the inventors of the present application considered as follows.

First, in order to realize the miniaturization of a semiconductor device, in a QFN structure, they examined the structure of making the peripheral part of the semiconductor chip overlapping on the lead arranged around the tab (chip mounting part) so that the biggest possible semiconductor chip could be mounted. That is, it is the structure where the end portion of the chip side of each lead was dived into the lower part of the semiconductor chip.

Hereby, although it can deal with the miniaturization of a semiconductor device, with such a structure, a tab constitutes inevitably the so-called small tab structure whose size of the contour is smaller than the contour size of a semiconductor chip.

Next, when the heat radiation property of a semiconductor device is taken into consideration, a QFN of the so-called tab exposure type which exposes the back surface of the tab at the back surface of the sealing body can be considered. That is, it becomes a QFN of a tab exposure type and a small tab structure in this case. Here, although the heat radiation property improves by exposing a tab from a sealing body, the heat radiation property can be improved more by connecting to the electrode of a mounting substrate the tab exposed from the sealing body via a jointing material.

However, in a QFN of such small tab structure, the area of the chip supporting surface of the tab becomes comparatively small. Therefore, in order to certainly fix a semiconductor chip to a tab with such small contour size, it is necessary to form die bond material without a clearance between the semiconductor chip and the tab. Hereby, the silver paste (paste material) which is the die bond material may overflow the chip supporting surface. In the die bond step of a semiconductor chip, the silver paste overflowing from a chip supporting surface will spread to the side surface of the tab, and will flow into the back surface of the tab. As a result, in the case of the structure of a tab exposure type, it is necessary to give exterior plating to the back surface of the tab. Since silver paste adheres to a package back surface, it becomes difficult to form exterior plating in the back surface of the tab. Hereby, it becomes difficult to fully improve the heat radiation property.

By using the binder of a film type as the die bond material, preventing the extrusion and outflow of the die bond material is also considered in this case. However, the binder of a film type has high material cost compared with paste material, and the reduction of a manufacturing cost becomes difficult. When using a film type, it is also difficult to arrange a film correctly to the chip supporting surface of the tab.

In Patent Reference 1 (Japanese patent laid-open No. Hei 6 (1994)-216303), the example of the semiconductor device of small tab structure is described. However, as described above in the small tab structure, the phenomenon in which paste material overflows happens easily, and it is a problem to make the element into which the paste material flows.

In the package structure described in Patent Reference 2 (Japanese patent laid-open No. 2000-243891), offset processing of the die pad (tab) is done. That is, offset processing which pushes up the central part of the die pad with a press from a back surface side is performed. As a result, the main surface (chip supporting surface) of the central part of the die pad constitutes a position higher than the main surface (wire connection surface) of a lead, and has a structure such that thickness reduction of a package is difficult.

Since offset processing is comprised, the peripheral part formed of offset processing of a die pad needs to take the large width of a level difference. From these, the area of the central part of the die pad becomes small, and a junction area with a semiconductor chip also becomes small. As a result, the problem that the joining reliability and heat radiation property of a semiconductor chip fall arises.

A purpose of the present invention is to offer the technology which can prevent the outflow of die bond material and can improve the quality and reliability of a semiconductor device.

The above-described and the other purposes and novel features of the present invention will become apparent from the description herein and accompanying drawings.

Of the inventions disclosed in the present application, typical ones will next be summarized briefly.

That is, a semiconductor device of this invention comprises a plurality of leads arranged around a chip mounting part, paste material arranged over a chip supporting surface of the chip mounting part, a semiconductor chip mounted via the paste material over the chip supporting surface of the chip mounting part, a plurality of wires electrically connecting a plurality of electrodes of the semiconductor chip, and the leads, respectively, and a sealing body doing resin seal of the semiconductor chip, the wires, a part of each of the leads, and a part of the chip mounting part. Furthermore, as for this invention, a contour size of the chip supporting surface of the chip mounting part is smaller than a back surface of the semiconductor chip, a back surface of an opposite side of the chip supporting surface of the chip mounting part is exposed from the sealing body, and a step part whose height is lower than the chip supporting surface is formed in an edge part of the chip supporting surface of the chip mounting part.

And, this invention comprises the steps of providing a lead frame which has a chip mounting part having a step part whose height is lower than a chip supporting surface formed in an edge part of the chip supporting surface, and a plurality of leads arranged around the chip mounting part, applying paste material over the chip supporting surface of the chip mounting part, and joining a semiconductor chip via the paste material over the chip supporting surface of the chip mounting part whose contour size is smaller than a back surface of the semiconductor chip. Furthermore, this invention comprises the steps of electrically connecting a plurality of electrodes of the semiconductor chip, and the leads, respectively, and injecting resin for sealing into a cavity where a plurality of semiconductor device formation regions are covered by one cavity of a resin-molding metallic mold, circulating the resin for sealing between the semiconductor chip, and the step part of the chip mounting part, and doing resin seal of the semiconductor chip so that a back surface which is an opposite side of the chip supporting surface of the chip mounting part, and a part of each of the leads may be exposed.

Advantages achieved by some of the most typical aspects of the invention disclosed in the present application will be briefly described below.

By forming in the edge part of the chip supporting surface of a chip mounting part the step part whose height is lower than a chip supporting surface, the paste material (die bond material) protruded from the chip mounting part can be stopped at this step part, and an outflow to the back surface of a sealing body of paste material can be prevented. It can be prevented that paste material adheres to the exterior plating on the back surface of a package thereby causing the problem of it becoming impossible to form exterior plating, which problem is thereby stopped further. As a result, the quality and reliability of a semiconductor device can be improved.

By forming in the step part of a chip mounting part the protruding portion projecting toward the semiconductor chip, an anchor effect can raise the adhesion of resin and a chip mounting part. Hereby, peeling by the step part of a chip mounting part can be suppressed. As a result, it becomes difficult for an impurity to enter into the interface of a chip mounting part and resin, and the discoloration of exterior plating by the outflow of an impurity can be prevented. Therefore, the quality and reliability of a semiconductor device can be improved.

DETAILED DESCRIPTION OF THE PREFERRED EMBODIMENTS

Figure 1:
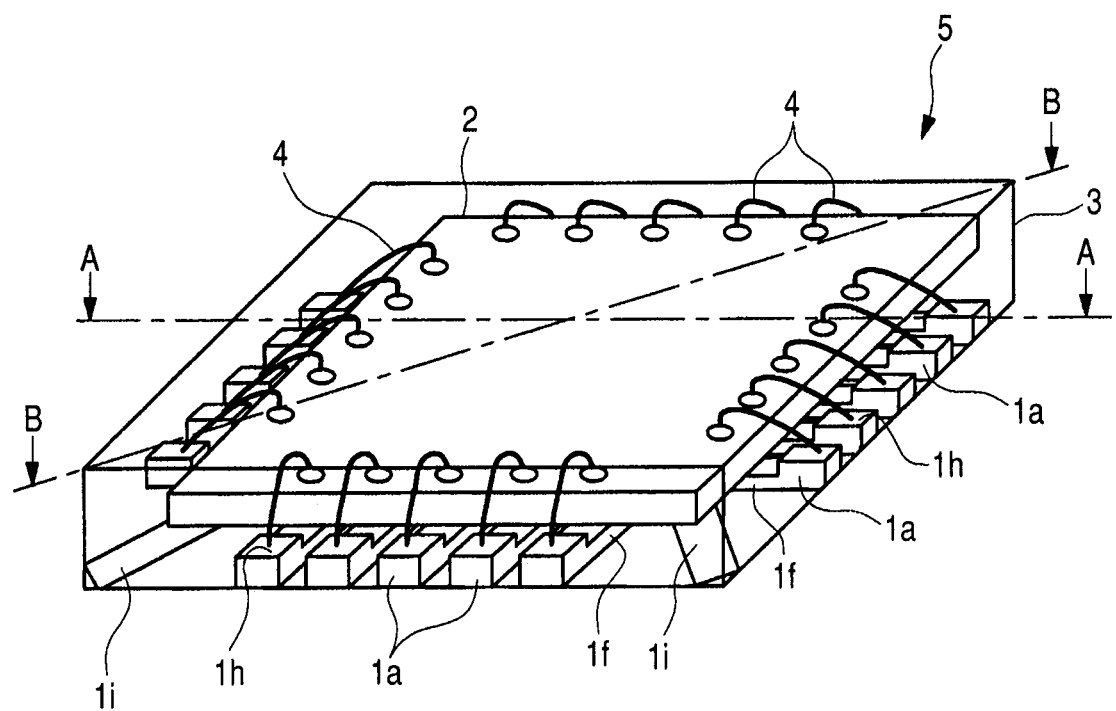
FIG. 1 is a perspective view penetrating a sealing body and showing an example of the structure of the semiconductor device of Embodiment 1 of the present invention.

In the following embodiments, except when especially required, explanation of identical or similar parts is not repeated in principle.

Furthermore, in the below-described embodiments, a description will be made after dividing into plural sections or into plural embodiments if necessary for convenience sake. These plural sections or embodiments are not independent of each other, but in relation such that one is a modification example, details or a complementary description of a part or whole of the other one unless otherwise specifically indicated.

In the below-described embodiments, when a reference is made to the number of elements (including the number, value, amount and range), the number is not limited to a specific number but may be equal to or greater than or less than the specific number, unless otherwise specifically indicated or principally apparent that the number is limited to the specific number.

Hereafter, embodiments of the invention are explained in detail based on the drawings. In all the drawings for describing the embodiments, members of a like function will be identified by like reference numerals and overlapping descriptions will be omitted.

Embodiment 1

Figure 2:
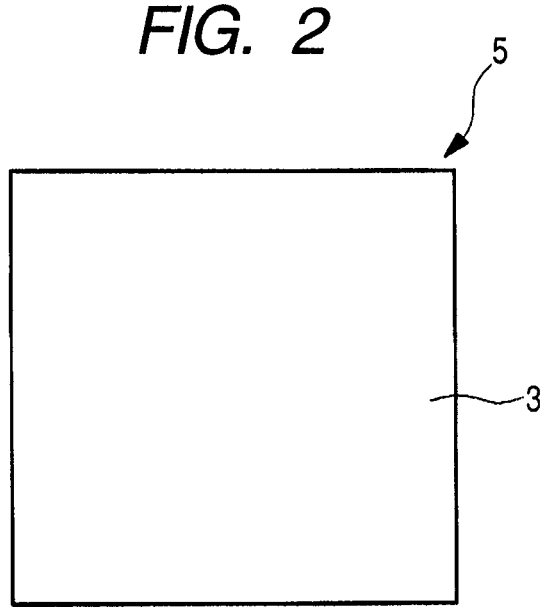
FIG. 2 is a plan view showing the structure of the semiconductor device shown in FIG. 1.
Figure 3:
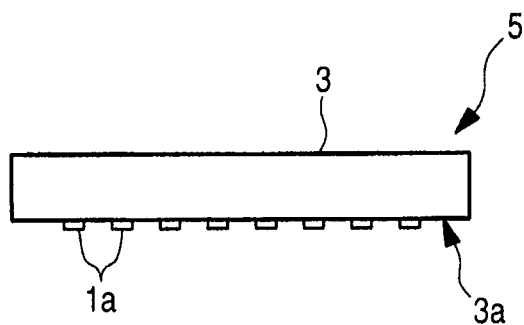
FIG. 3 is a side view showing the structure of the semiconductor device shown in FIG. 1.
Figure 4:
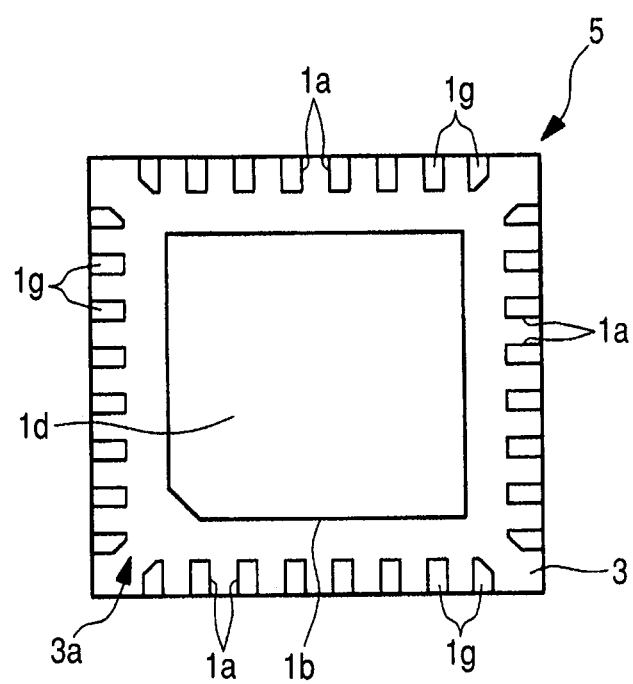
FIG. 4 is a back view showing the structure of the semiconductor device shown in FIG. 1.
Figure 5:
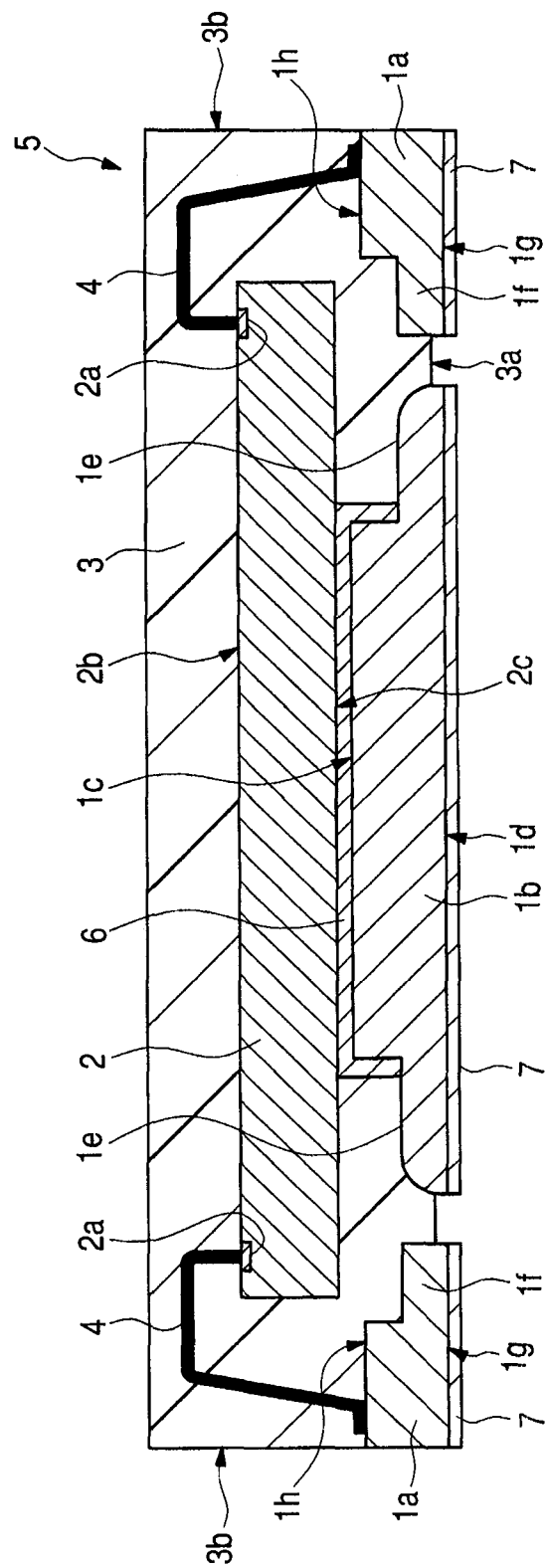
FIG. 5 is a cross-sectional view showing an example of the structure cut along the A-A line shown in FIG. 1.
Figure 6:
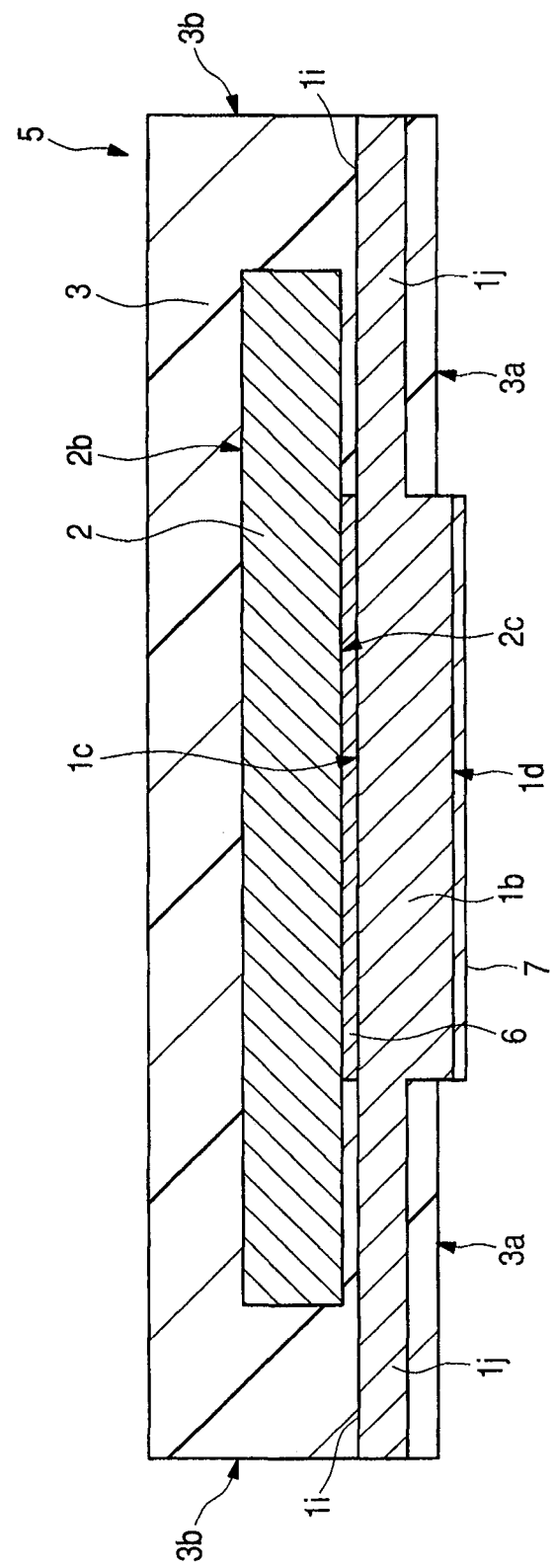
FIG. 6 is a cross-sectional view showing an example of the structure cut along the B-B line shown in FIG. 1.
Figure 7:
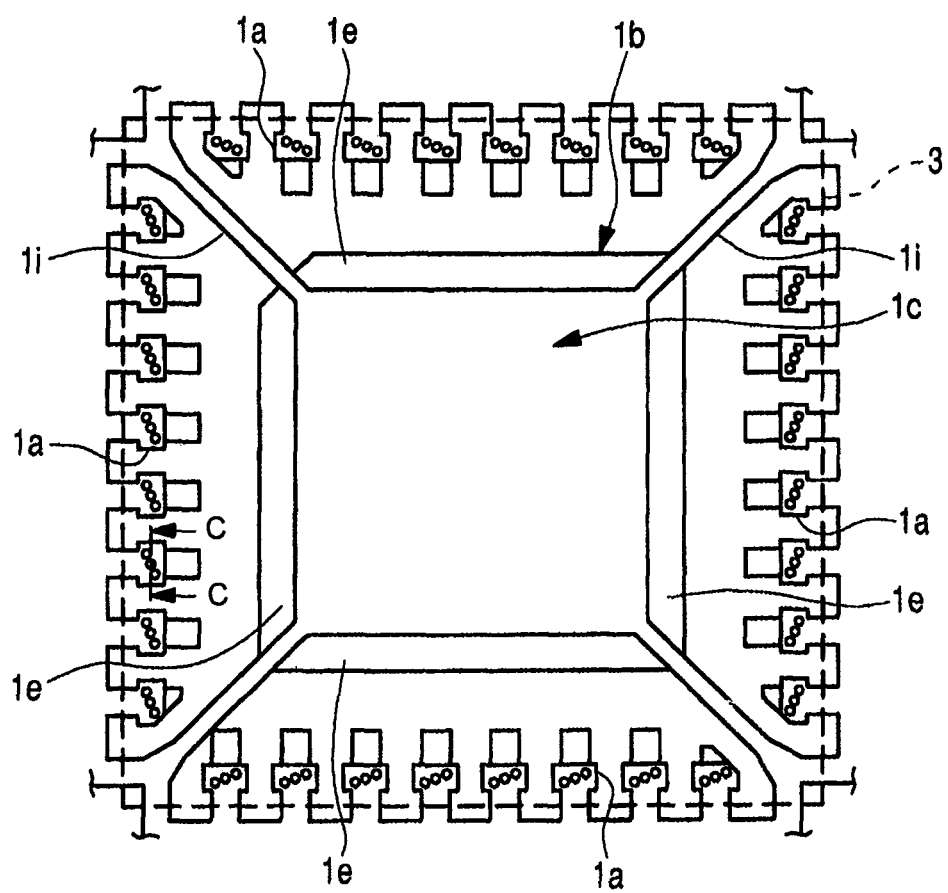
FIG. 7 is a partial plan view penetrating a sealing body and showing the structure of a tab, a suspension lead, and a lead in the semiconductor device shown in FIG. 1.
Figure 8:
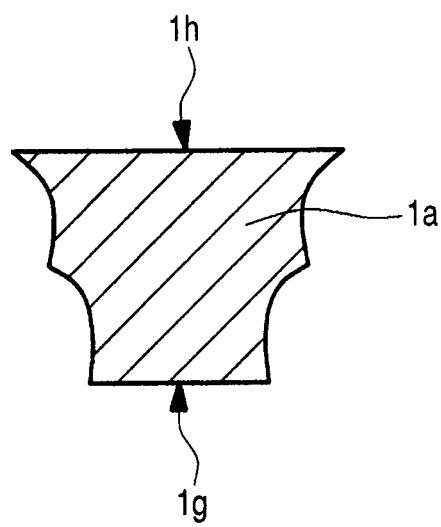
FIG. 8 is a cross-sectional view cut along the C-C line shown in FIG. 7.
Figure 9:
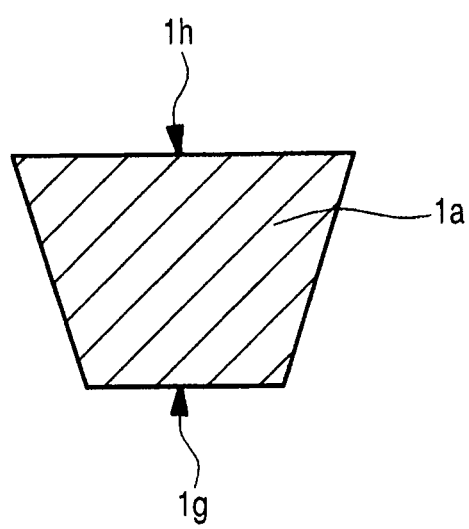
FIG. 9 is a modification chart of FIG. 8.

FIG. 1 is a perspective view penetrating a sealing body and showing an example of the structure of the semiconductor device of Embodiment 1 of the present invention, FIG. 2 is a plan view showing the structure of the semiconductor device shown in FIG. 1, FIG. 3 is a side view showing the structure of the semiconductor device shown in FIG. 1, FIG. 4 is a back view showing the structure of the semiconductor device shown in FIG. 1, FIG. 5 is a cross-sectional view showing an example of the structure cut along the A-A line shown in FIG. 1, FIG. 6 is a cross-sectional view showing an example of the structure cut along the B-B line shown in FIG. 1, FIG. 7 is a partial plan view penetrating a sealing body and showing the structure of a tab, a suspension lead, and a lead in the semiconductor device shown in FIG. 1, FIG. 8 is a cross-sectional view cut along the C-C line shown in FIG. 7, and FIG. 9 is a modification chart of FIG. 8.

The semiconductor device of Embodiment 1 shown in FIG. 1-FIG. 9 is a resin molded type, and is a small semiconductor package, and is a thing of the non-lead type such that each mounting surface 1g of a plurality of leads 1a was exposed to the edge part of back surface 3a of sealing body 3, and has been stood in a line and arranged. Embodiment 1 takes up and explains a QFN 5 as an example of the semiconductor device. Although QFN 5 of Embodiment 1 is a small semiconductor package, it brings the size of semiconductor chip 2 mounted close to the size of a package as much as possible.

When the structure of QFN 5 is explained, a tab (it is also called a die pad) 1b which is the chip mounting part provided with chip supporting surface 1c on which semiconductor chip 2 can be mounted, a plurality of suspension leads 1i formed in one with tab 1b, a plurality of leads 1a which were located between a plurality of suspension leads 1i, and have been arranged around tab 1b, silver paste 6 which has been arranged on chip supporting surface 1c of tab 1b and which is paste material, and semiconductor chip 2 mounted via silver paste 6 on chip supporting surface 1c of tab 1b are included. Furthermore, QFN 5 has electrically conductive wires 4 which are a plurality of gold wires which electrically connect a plurality of pads (electrodes) 2a of semiconductor chip 2, and a plurality of leads 1a, respectively, and sealing body 3 which does the resin seal of semiconductor chip 2, a plurality of wires 4, each part of a plurality of leads 1a, and a part of tabs 1b.

Tab 1b, suspension lead 1i, and a plurality of leads 1a comprise the same lead frame.

In QFN 5, the contour size (an outline dimension, area) of chip supporting surface 1c of tab 1b is formed smaller than back surface 2c of semiconductor chip 2, as shown in FIG. 5. The back surface 1d of the opposite side of chip supporting surface 1c of tab 1b is exposed from sealing body 3, as shown in FIG. 4. As shown in FIG. 5, step part 1e with low height is formed in the edge part of chip supporting surface 1c of tab 1b from chip supporting surface 1c.

That is, QFN 5 is a small tab structure and it is a semiconductor package of a tab exposure type. Step part 1e with low height from chip supporting surface 1c is formed in the part (refer to FIG. 7) except suspension lead 1i in the edge part of chip supporting surface 1c of tab 1b.

Step part 1e of the edge part of tab 1b is formed by half etching processing, for example. For example, when the board thickness of a lead frame is 0.2 mm, the thickness of tab 1b is also 0.2 mm. Step part 1e constitutes 0.1 mm of board thickness by half etching processing in this case. That is, the height of step part 1e constitutes a position lower 0.1 mm than chip supporting surface 1c. Step part 1e catches silver paste 6 overflowed and protruded from chip supporting surface 1c of tab 1b. Step part 1e is for making step part 1e stop overflowing silver paste 6, and making it not be exposed to back surface 3a of sealing body 3.

Since the back surface 1d of tab 1b is exposed from back surface 3a of sealing body 3 as shown in FIG. 4, QFN 5 can increase the heat radiation property.

Although step part 1e is formed, press working, such as offset processing, is not performed to tab 1b of QFN 5 of Embodiment 1. Therefore, in QFN 5, as shown in FIG. 5, chip supporting surface 1c of tab 1b and each wire connection surface 1h of a plurality of leads 1a constitute the same height.

That is, in QFN 5, a bending process like offset processing is not performed to tab 1b. Therefore, thickness reduction of a package (QFN 5) can be aimed at as compared with the semiconductor package to which offset processing was performed and which came to be at a position higher than the wire connection surface of a lead near the central part of the die pad.

Although QFN 5 of Embodiment 1 is a small semiconductor package, chip size is brought as much as possible close to package size so that it can further miniaturization and thickness reduction.

Therefore, it has structure that the peripheral part of semiconductor chip 2 was made to overlap on lead 1a arranged around tab 1b so that the biggest possible semiconductor chip 2 can be mounted.

That is, as shown in FIG. 1 and FIG. 5, the end portion of each chip side of a plurality of leads 1a has faced the edge part of back surface 2c of semiconductor chip 2. In this case, first thin portion 1f was formed in the end portion of each chip side of a plurality of leads 1a, and this first thin portion 1f has faced back surface 2c of semiconductor chip 2. Hereby, even if the front surface (wire connection surface) of lead 1a and chip supporting surface (main surface) 1c of tab 1b constitute the same height, the contact failure of the edge part in back surface 2c of semiconductor chip 2 and the end portion located in the chip side of each lead 1a can be suppressed. As a result, semiconductor chip 2 of the size near package size can be mounted, maintaining a miniaturization and thickness reduction of a semiconductor device.

First thin portion 1f is formed by half etching processing, for example. For example, when the board thickness of a lead frame is 0.2 mm, the thickness of each lead 1a is also 0.2 mm. First thin portion 1f constitutes 0.1 mm of board thickness by half etching processing in this case.

Thus, since it is the structure where each first thin portion 1f of a plurality of leads 1a was dived into the lower part of the peripheral part of back surface 2c of semiconductor chip 2, tab 1b has inevitably the so-called small tab structure whose size of the contour is smaller than the contour size of back surface 2c of semiconductor chip 2.

As shown in FIG. 1 and FIG. 5, the termination of the end portion which is the opposite side to the chip side of each lead 1a is done exposing to side surface 3b of sealing body 3.

In QFN 5, silver paste 6 is adopted as die bond material, and reduction of a manufacturing cost can be aimed at as compared with using the binder of a film type. However, of adoption of silver paste 6, since the measures against an outflow are needed, step part 1e is formed in the edge part of tab 1b as measures against an outflow of this silver paste 6.

Since step part 1e is formed in the edge part of tab 1b, chip supporting surface 1c of tab 1b can fully be soaked with silver paste 6 in QFN 5. That is, in QFN 5, as shown in FIG. 5, silver paste 6 is arranged all over chip supporting surface 1c of tab 1b.

Thus, by silver paste 6 being arranged all over chip supporting surface 1c of tab 1b, since a clearance becomes hard to be formed between tab 1b and semiconductor chip 2, it can be reduced so that a void is formed in silver paste 6.

Next, as shown in FIG. 8, lead 1a is formed so that the width of wire connection surface 1h may become thicker than the width of the mounting surface 1g exposed from sealing body 3 by half etching. Simply saying, its section form is formed in the shape of an inverted trapezoid.

This has suppressed the problem that a plurality of leads 1a drop out of sealing body 3. Here, although Embodiment 1 explained forming by half etching, it is not limited to this, and as shown in FIG. 9, it may be formed by press working. However, since tab 1b and step part 1e are formed by half etching processing as described above, it is also forming a plurality of leads 1a by half etching processing, and simplification of a step can be aimed at.

About tab 1b, since step part 1e for making overflowing silver paste 6 stop is formed by half etching processing from the upper surface (chip supporting surface) side on the other hand, it is difficult to form the section form in inverted trapezoid form.

So, in Embodiment 1, the measures which prevent falling of tab 1b are taken against a plurality of suspension leads 1i connected with tab 1b.

That is, suspension lead 1i extending and existing toward a corner part while connecting with tab 1b is provided with second thin portion 1j in which the back surface side was shaved by half etching, and which was formed thinly as shown in FIG. 6. Hereby, second thin portion 1j is embedded in sealing body 3, and is doing the termination of the end portion exposing to side surface 3b of the corner part of sealing body 3. The point of suspension lead 1i is branched and is made to be exposed from each side surface of an adjoining sealing body at this time, as shown in FIG. 7. Thus, it becomes possible to cut a plurality of leads 1a and suspension lead 1i according to the same dicing step, and simplification of a step can be aimed at.

Thus, second thin portion 1j of suspension lead 1i connected with tab 1b by the four corner parts is embedded in sealing body 3. Hereby, that tab 1b connected with suspension lead 1i falls out (drops out) from sealing body 3 can be prevented.

As shown in FIG. 5 and FIG. 6, exterior plating 7 is formed in the back surface 1d of tab 1b, and the mounting surface 1g of lead 1a. That is, exterior plating 7 which consists of Pb free solder, such as tin-bismuth, is formed in the back surface 1d of tab 1b which is a lead part exposed from sealing body 3, and the mounting surface 1g of lead 1a, for example.

Semiconductor chip 2 comprises silicon, for example, and a semiconductor element, and pad 2a which are a plurality of electrodes are formed in the main surface 2b. These pads 2a, and lead 1a corresponding to each pad 2a are electrically connected by respectively electrically conductive wire 4. Wire 4 is a gold wire, for example.

Each lead 1a, tab 1b, and suspension lead 1i comprise a copper alloy, for example, and each thickness is about 0.2 mm, for example.

Sealing body 3 comprises the thermosetting resin of an epoxy system, for example.

According to the semiconductor device (QFN 5) of Embodiment 1, step part 1e with low height from chip supporting surface 1c is formed in the edge part of chip supporting surface 1c of tab 1b. Silver paste 6 (die bond material) protruded from tab 1b can be caught by this step part 1e and, by this, step part 1e can be made to stop it.

An outflow to the back surface 3a of sealing body 3 of silver paste 6 can be prevented, and it can be prevented that silver paste 6 adheres to exterior plating 7 on the back surface of a package as a result. It stops causing the problem of it becoming impossible to form exterior plating 7.

As a result, the quality and reliability of QFN 5 (semiconductor device) can be improved.

Embodiment 2

Figure 10:
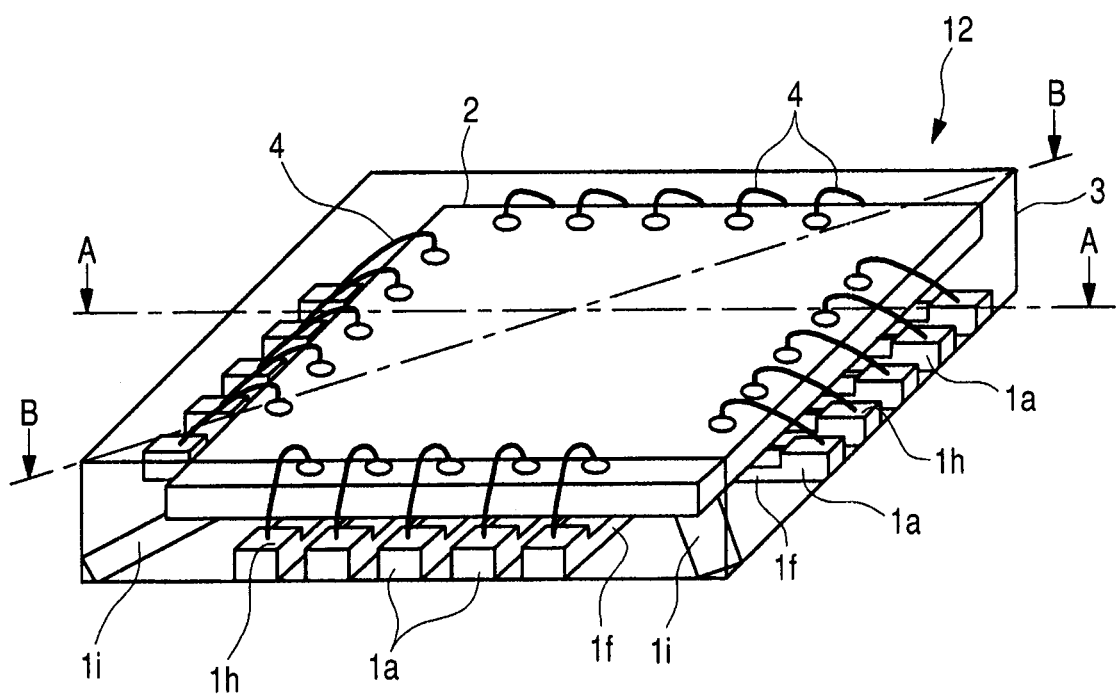
FIG. 10 is a perspective view penetrating a sealing body and showing an example of the structure of the semiconductor device of Embodiment 2 of the present invention.
Figure 11:
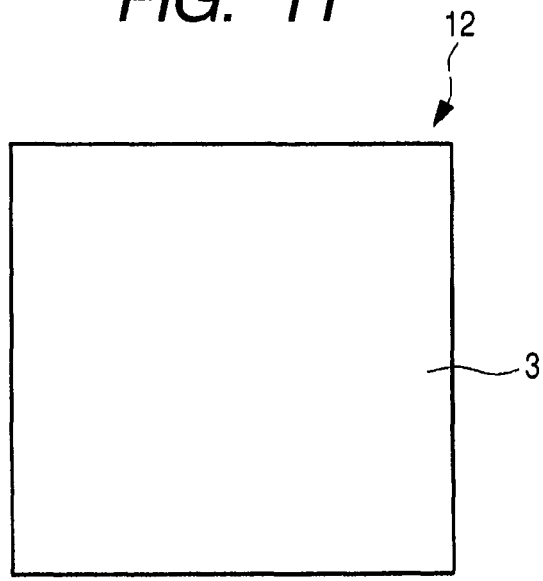
FIG. 11 is a plan view showing the structure of the semiconductor device shown in FIG. 10.
Figure 12:
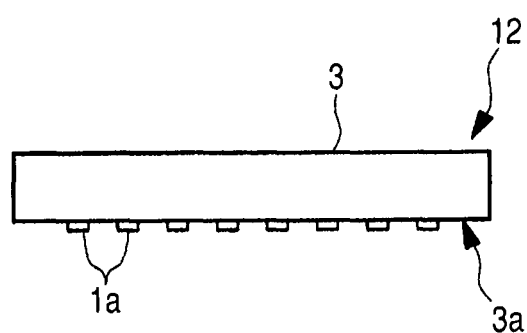
FIG. 12 is a side view showing the structure of the semiconductor device shown in FIG. 10.
Figure 13:
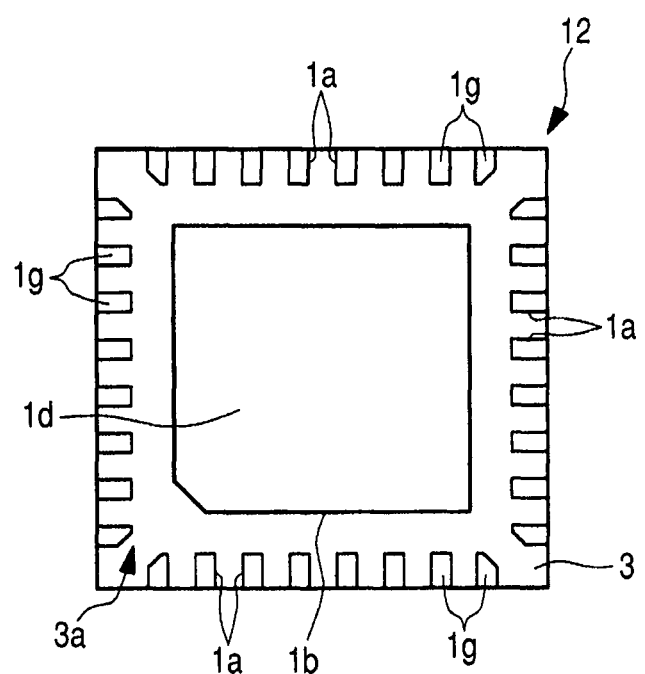
FIG. 13 is a back view showing the structure of the semiconductor device shown in FIG. 10.
Figure 14:
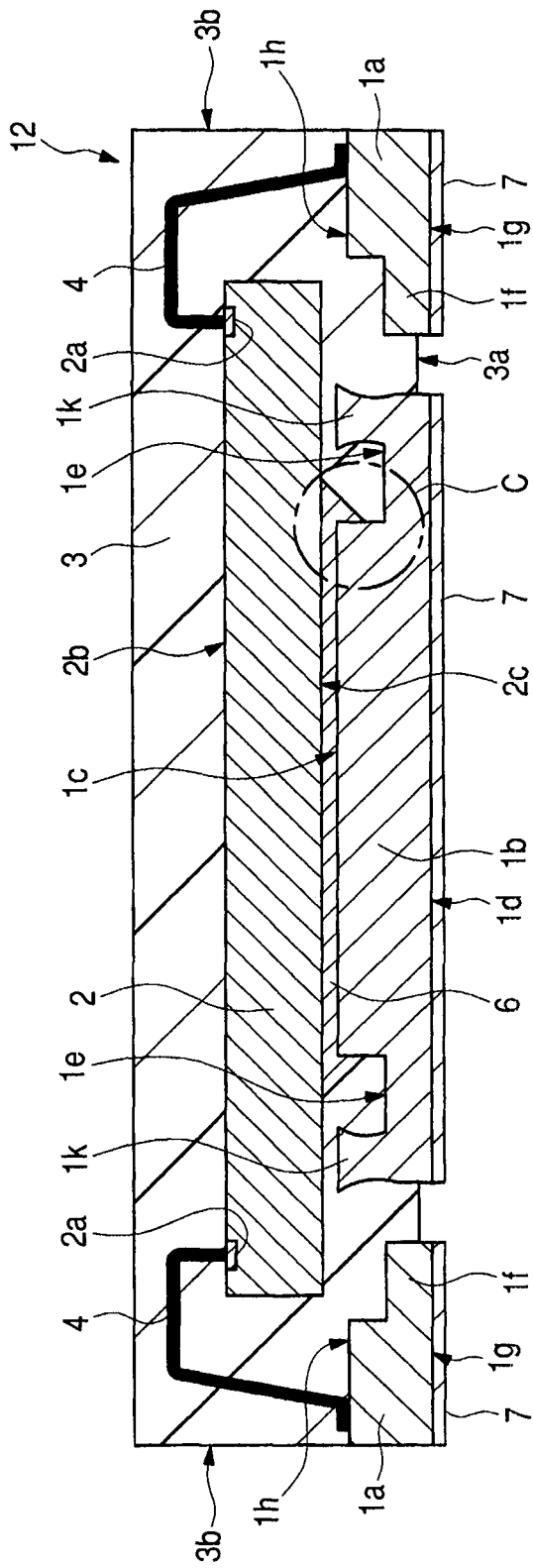
FIG. 14 is a cross-sectional view showing an example of the structure cut along the A-A line shown in FIG. 10.
Figure 15:
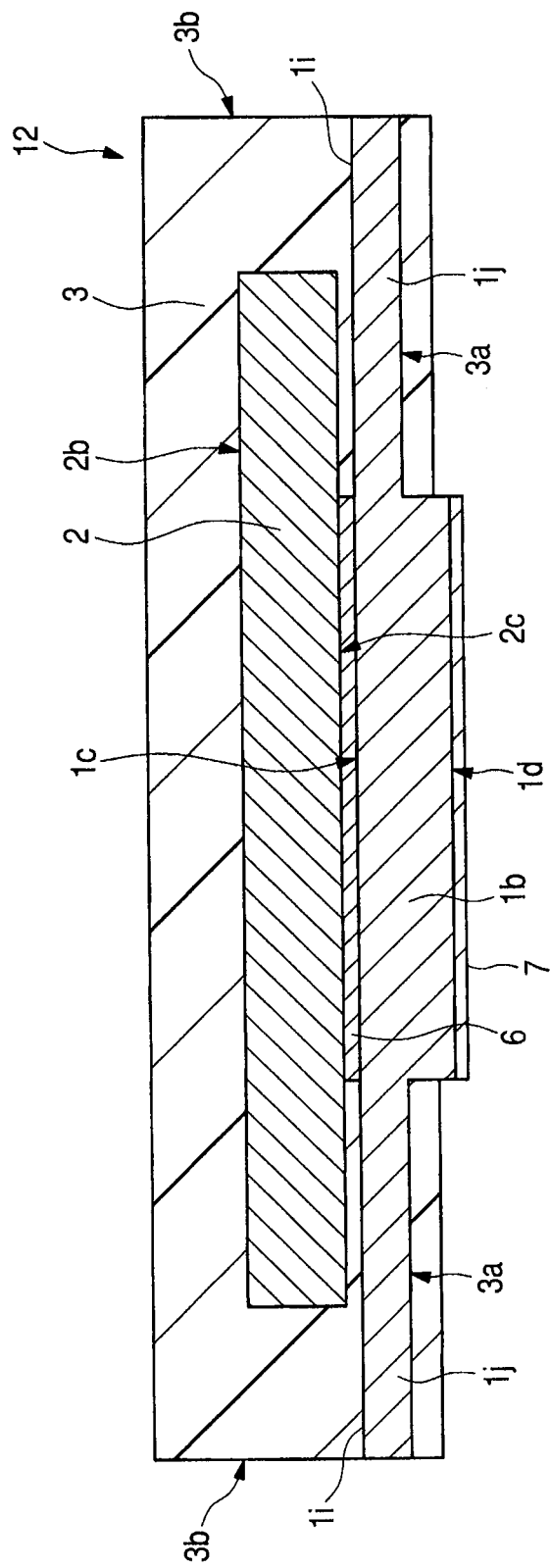
FIG. 15 is a cross-sectional view showing an example of the structure cut along the B-B line shown in FIG. 10.
Figure 16:
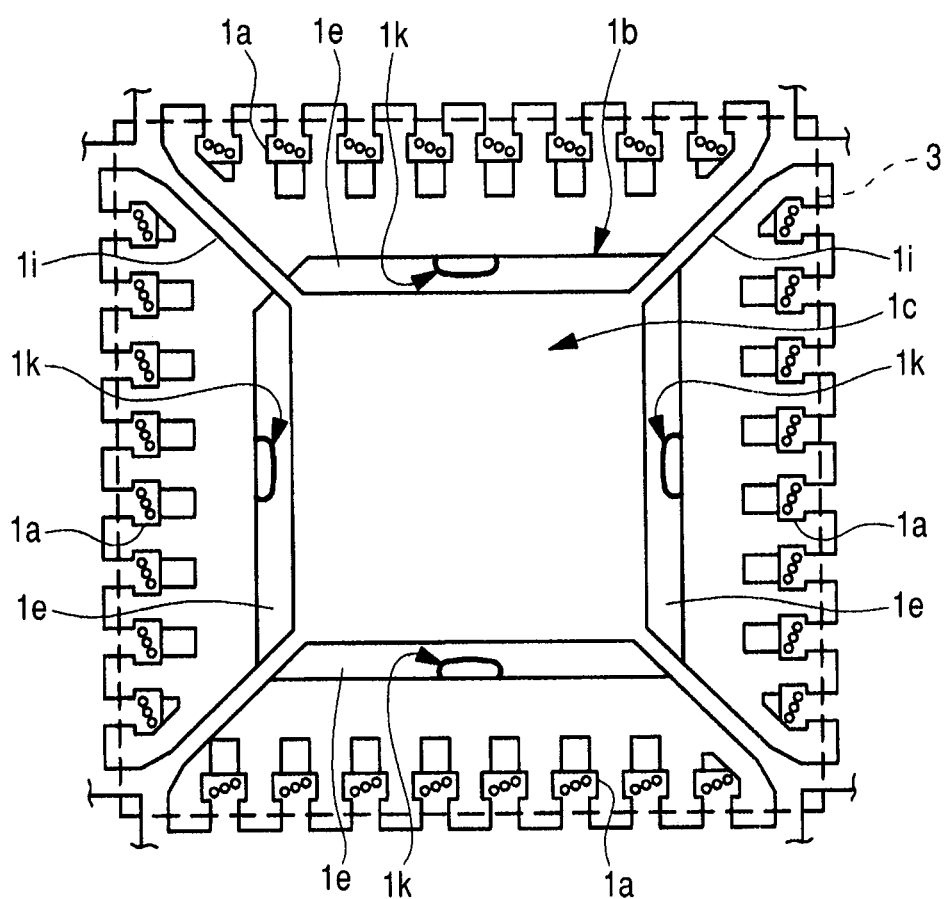
FIG. 16 is a partial plan view penetrating a sealing body and showing the structure of a tab and a protruding portion in the semiconductor device shown in FIG. 10.
Figure 17:
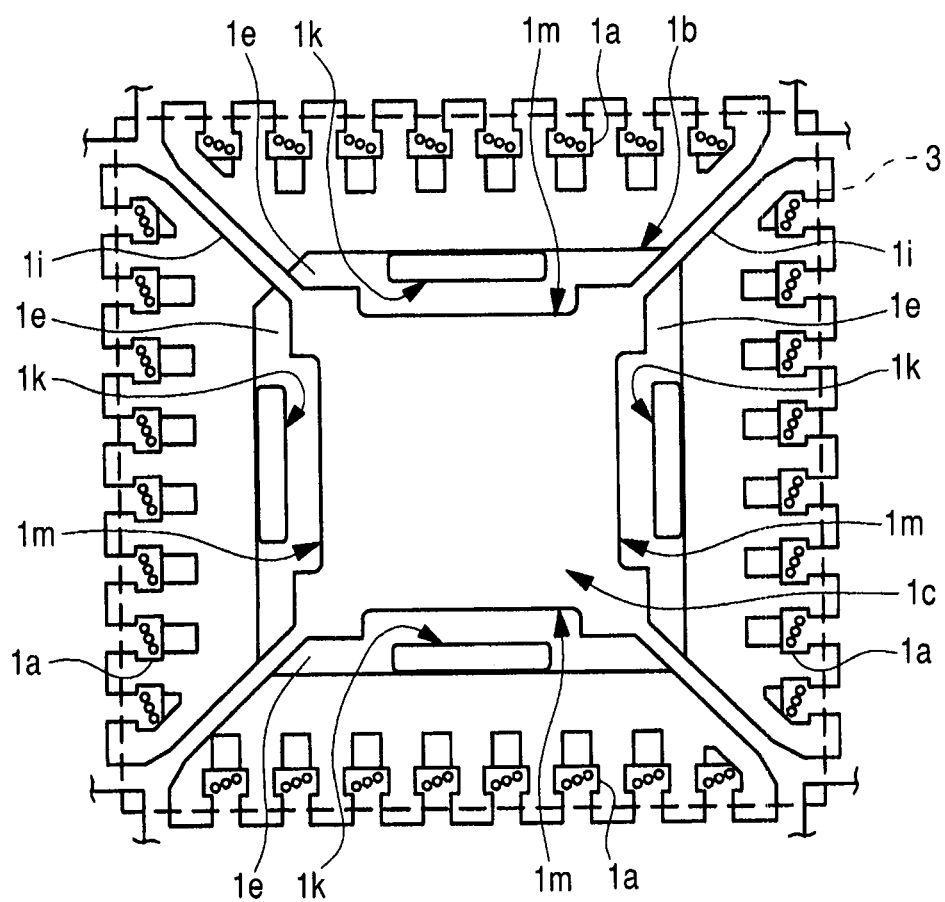
FIG. 17 is a partial plan view penetrating a sealing body and showing the structure of a tab and a protruding portion in the semiconductor device of the modification of Embodiment 2 of the present invention.
Figure 18:
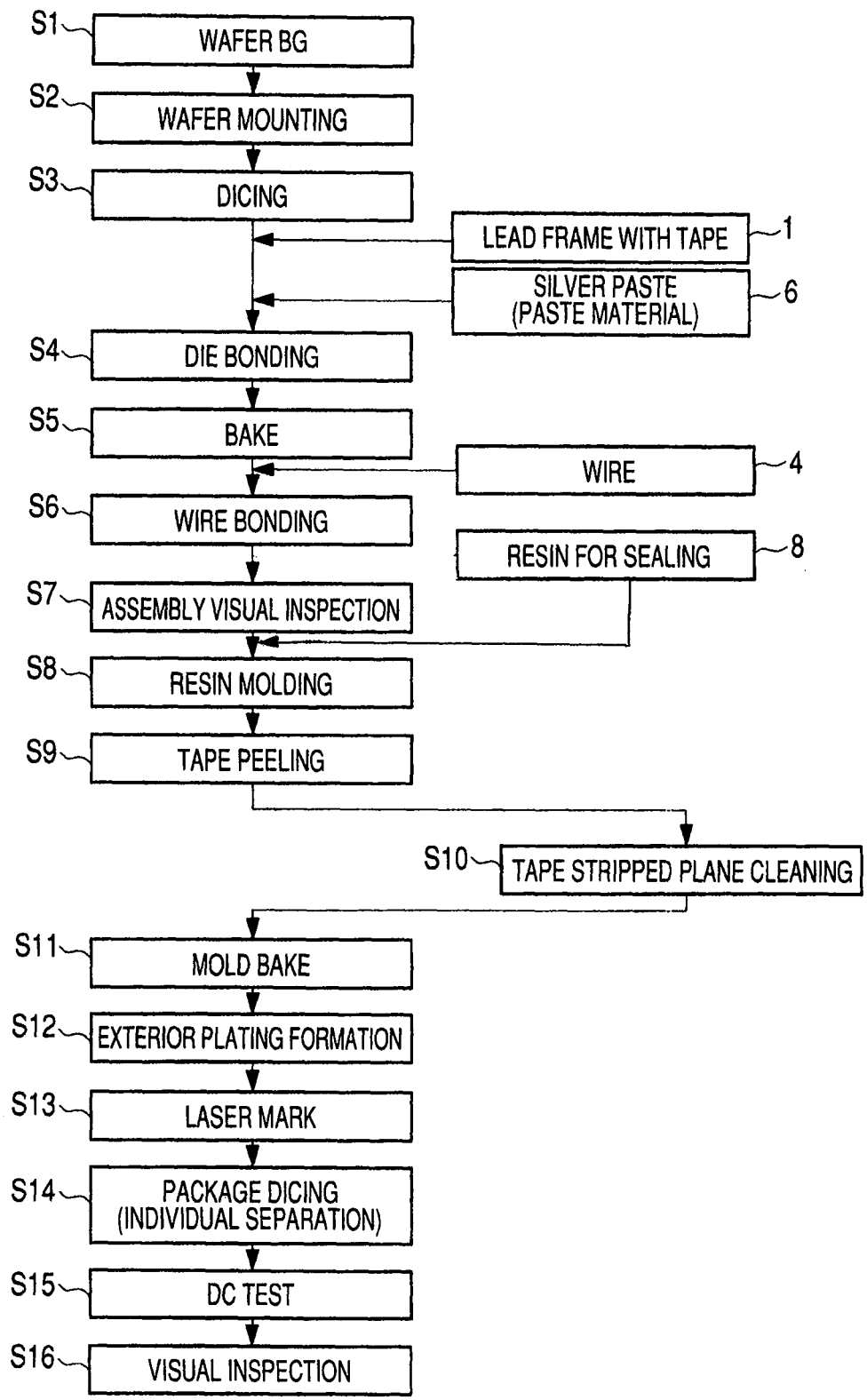
FIG. 18 is a manufacturing flow chart showing an example of the order of an assembly of the semiconductor device of Embodiment 2 of the present invention.
Figure 19:
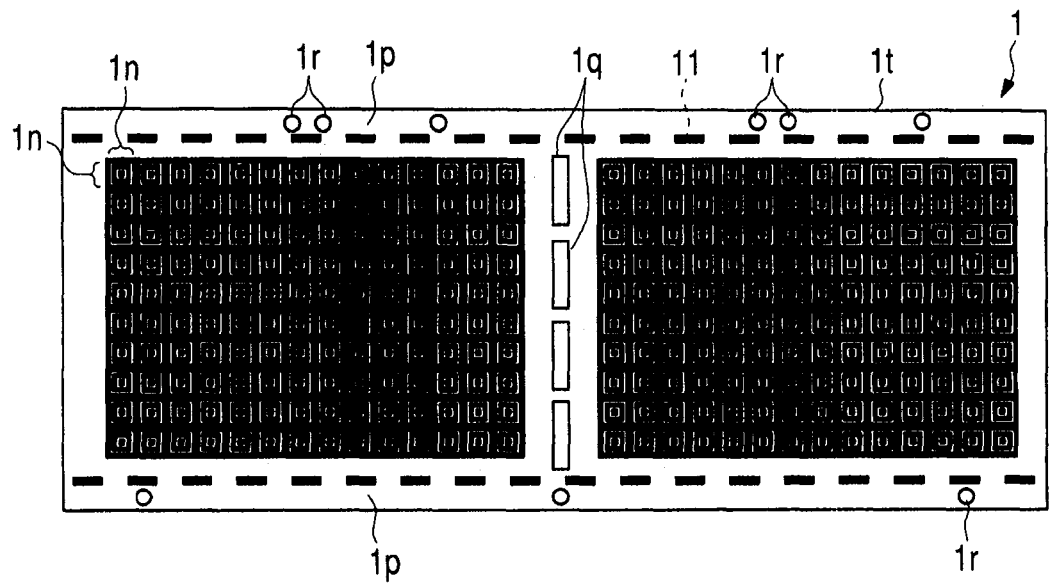
FIG. 19 is a plan view showing an example of the structure of a lead frame with a tape used for the assembly of the semiconductor device of Embodiment 2 of the present invention.
Figure 20:
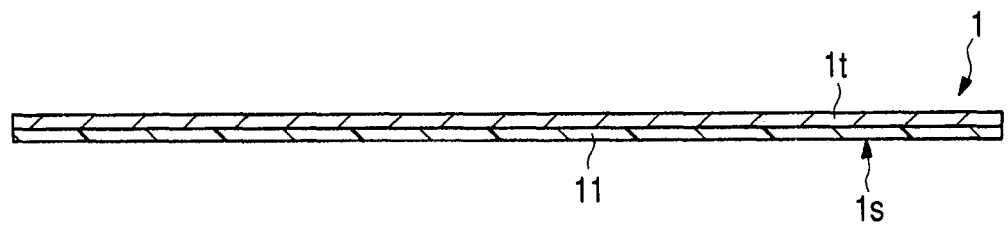
FIG. 20 is a cross-sectional view showing an example of the structure of the lead frame with a tape shown in FIG. 19.
Figure 21:
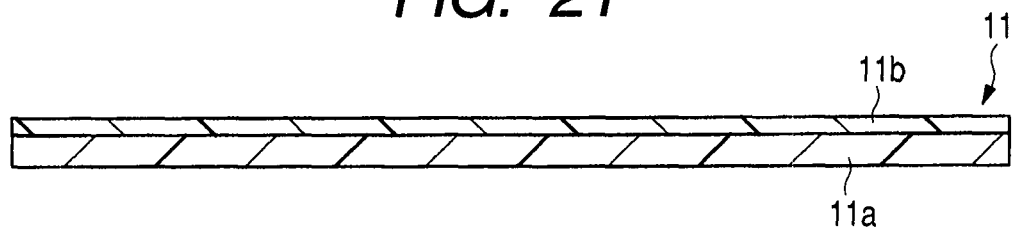
FIG. 21 is a cross-sectional view showing an example of the structure of the tape stuck on the lead frame for the tape shown in FIG. 19.

FIG. 10 is a perspective view penetrating a sealing body and showing an example of the structure of the semiconductor device of Embodiment 2 of the present invention, FIG. 11 is a plan view showing the structure of the semiconductor device shown in FIG. 10, FIG. 12 is a side view showing the structure of the semiconductor device shown in FIG. 10, FIG. 13 is a back view showing the structure of the semiconductor device shown in FIG. 10, FIG. 14 is a cross-sectional view showing an example of the structure cut along the A-A line shown in FIG. 10, and FIG. 15 is a cross-sectional view showing an example of the structure cut along the B-B line shown in FIG. 10. And, FIG. 16 is a partial plan view penetrating a sealing body and showing the structure of a tab and a protruding portion in the semiconductor device shown in FIG. 10, FIG. 17 is a partial plan view penetrating a sealing body and showing the structure of a tab and a protruding portion in the semiconductor device of the modification of Embodiment 2 of the present invention, and FIG. 18 is a manufacturing flow chart showing an example of the order of an assembly of the semiconductor device of Embodiment 2 of the present invention. Furthermore, FIG. 19 is a plan view showing an example of the structure of a lead frame with a tape used for the assembly of the semiconductor device of Embodiment 2 of the present invention, FIG. 20 is a cross-sectional view showing an example of the structure of the lead frame with a tape shown in FIG. 19, and FIG. 21 is a cross-sectional view showing an example of the structure of the tape stuck on the lead frame for the tape shown in FIG. 19.

Figure 22:
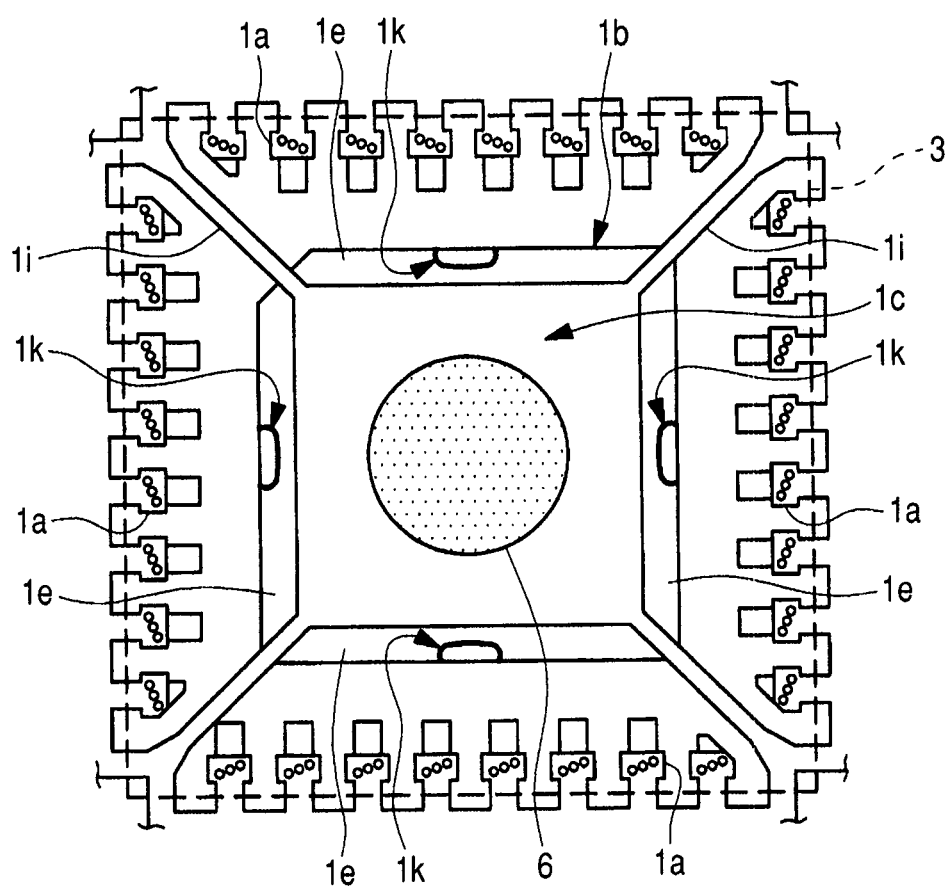
FIG. 22 is a partial plan view showing an example of the paste material application state in the die-bonding step of the assembly of the semiconductor device of Embodiment 2 of the present invention.
Figure 23:
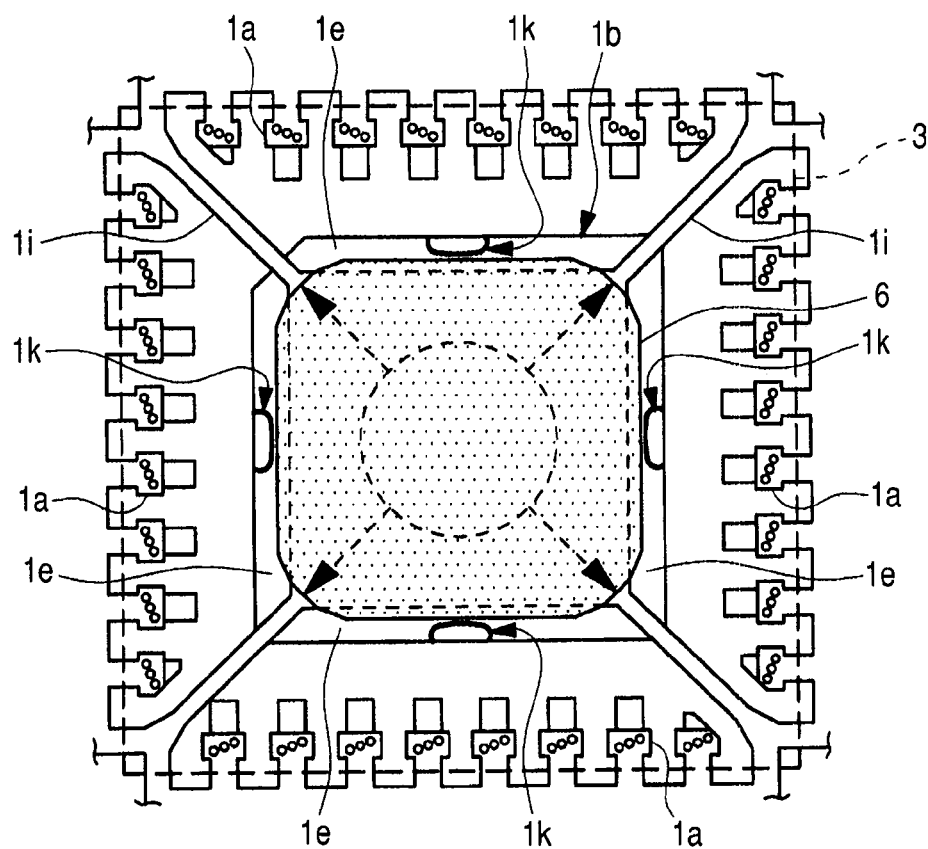
FIG. 23 is a partial plan view showing an example of a wettability breadth state after the paste material application in the die-bonding step of the assembly of the semiconductor device of Embodiment 2 of the present invention.
Figure 24:
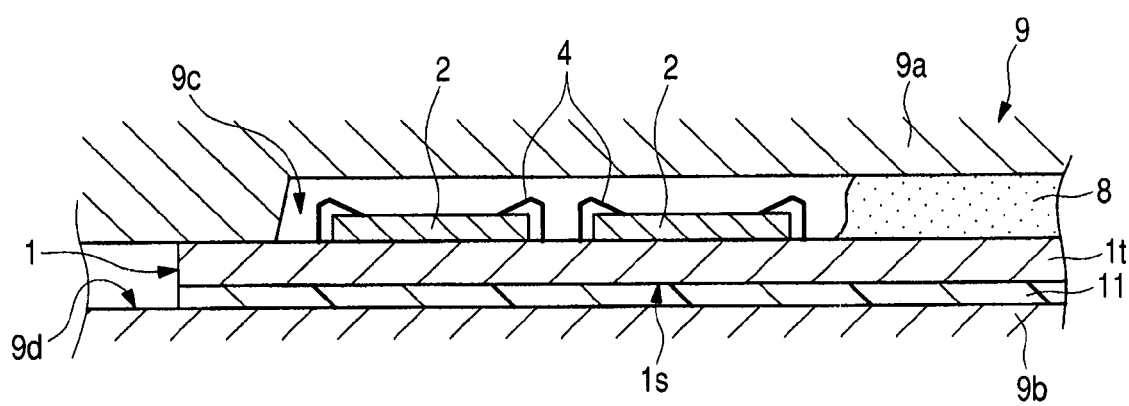
FIG. 24 is a partial sectional view showing an example of a resin injection state in the molding step of the assembly of the semiconductor device of Embodiment 2 of the present invention.
Figure 25:
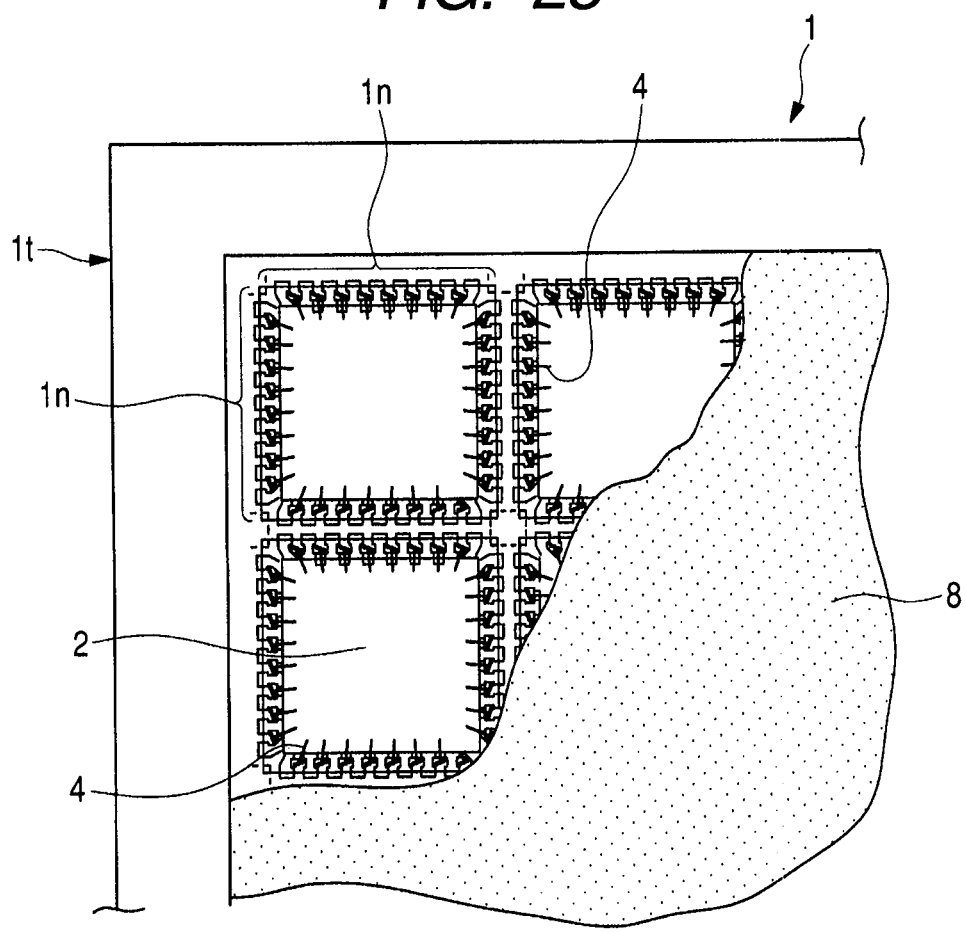
FIG. 25 is a partial plan view showing the resin injection state shown in FIG. 24.
Figure 26:
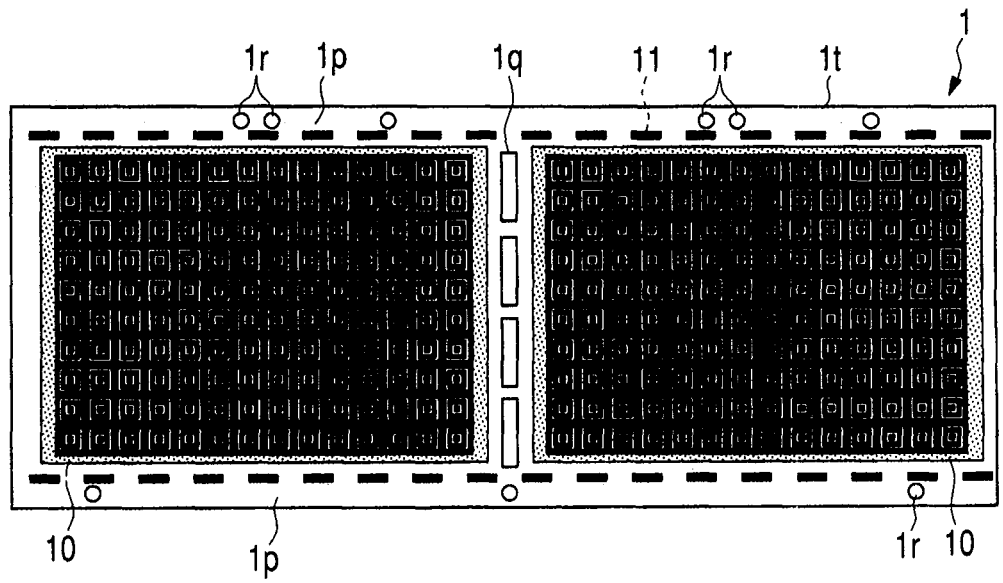
FIG. 26 is a plan view showing an example of the structure after mold completion of the assembly of the semiconductor device of Embodiment 2 of the present invention.
Figure 27:
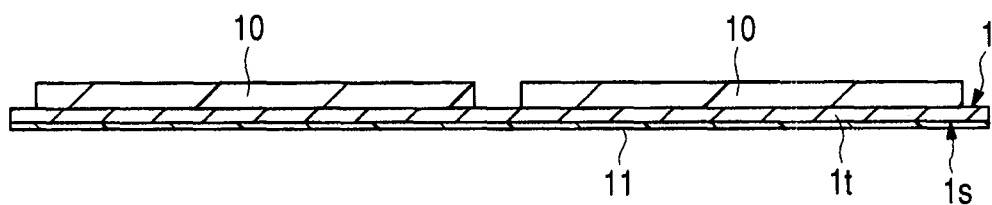
FIG. 27 is a cross-sectional view showing the structure after the mold completion shown in FIG. 26.

And, FIG. 22 is a partial plan view showing an example of the paste material application state in the die-bonding step of the assembly of the semiconductor device of Embodiment 2 of the present invention, and FIG. 23 is a partial plan view showing an example of a wettability breadth state after the paste material application in the die-bonding step of the assembly of the semiconductor device of Embodiment 2 of the present invention. Furthermore, FIG. 24 is a partial sectional view showing an example of a resin injection state in the molding step of the assembly of the semiconductor device of Embodiment 2 of the present invention, FIG. 25 is a partial plan view showing the resin injection state shown in FIG. 24, FIG. 26 is a plan view showing an example of the structure after mold completion of the assembly of the semiconductor device of Embodiment 2 of the present invention, and FIG. 27 is a cross-sectional view showing the structure after the mold completion shown in FIG. 26. And, FIG. 28 is a cross-sectional view showing an example of a tape peeling state in the tape peeling process of the assembly of the semiconductor device of Embodiment 2 of the present invention.

Embodiment 2 explains the structure and the assembly of the semiconductor device (QFN 12) of a tab exposure type and small tab structure like QFN 5 of Embodiment 1. Especially about the part which is not explained, it has the same structure as Embodiment 1.

When assembling QFN 12 aiming at a miniaturization, a MAP (Mold Array Package) method is adopted from the height of the productive efficiency in many cases. That is, the number of picking of the product per frame is extremely increased by using a MAP method, and productive efficiency is raised.

Figure 28:
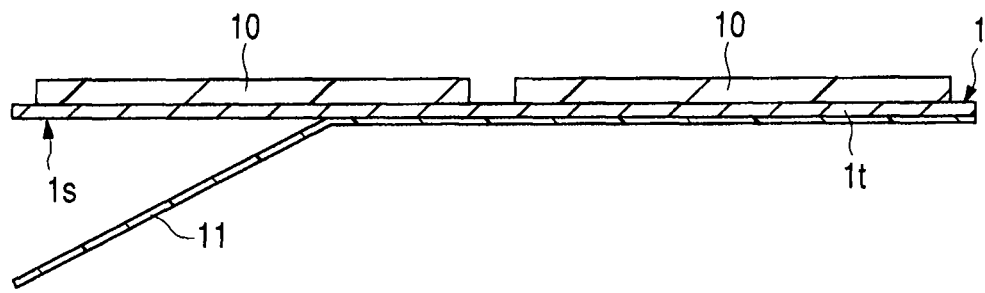
FIG. 28 is a cross-sectional view showing an example of a tape peeling state in the tape peeling process of the assembly of the semiconductor device of Embodiment 2 of the present invention.

When assembling QFN 12 by a MAP (Mold Array Package) method, at the molding step, as shown in FIG. 28, when peeling tape 11 from the back surface is of a lead frame, tape 11 with adhesive layer 11b is used. Therefore, the force to pull acts to tab (it is also called a die pad) 1b, and it becomes easy to generate peeling between step part 1e of tab 1b, and sealing body 3.

Here, the need for tape 11 with adhesive layer 11b in the assembly of QFN 12 is explained. When assembling QFN 12 by a MAP method, at the time of the clamp of resin-molding metallic mold 9 in the molding step, only the peripheral part of the outside of the product region on a lead frame can be clamped. When resin is injected into a resin-molding metallic mold in this state, near the center of a product region distant from the peripheral part of a lead frame, tape 11 will float from the lead frame with the pressure at the time of resin injection. Resin enters between a lead frame and tape 11, and a resin burr is formed in the back surface 1s of the lead frame.

Therefore, using tape 11 with adhesive layer 11b, where tape 11 is firmly pasted up on a lead frame via adhesive layer 11b, resin molding is performed, so that the resin burr may not be formed in the back surface 1s side of a lead frame.

That is, in the assembly of QFN 12, it is necessary to use tape 11 with adhesive layer 11b as measures against a resin burr.

Therefore, in the peeling process of tape 11 after the resin seal in a molding step, since tape 11 has adhered to the lead frame firmly via adhesive layer 11b, when peeling tape 11, the force acts in the direction in which tab 1b is also pulled and drops out, and it becomes easy to generate peeling between step part 1e of tab 1b, and sealing body 3. Silver paste 6 may be flowing into step part 1e of tab 1b, and in this case, the adhesion of tab 1b and sealing body 3 is falling, and peels especially easily. As a result, a clearance tends to be made there.

When peeling occurs between step part 1e of tab 1b, and sealing body 3, a clearance will be formed there and impurities, such as plating liquid, will enter the clearance at the step after the mold. Furthermore at a subsequent step, the impurity which entered the clearance oozes out, and the problem of exterior plating 7 discoloring arises.

Chemical solutions, such as an organic system solvent used by the tape stripped plane cleaning process after tape peeling for cleaning, enter the clearance, impurities, such as the chemical solution which entered the clearance at the subsequent step similarly, ooze out, and the problem of exterior plating 7 peeling arises.

Then, like QFN 5 of Embodiment 1, QFN 12 of Embodiment 2 is having formed step part 1e in tab 1b, and it suppresses peeling of step part 1e of tab 1b, and sealing body 3 while it prevents the outflow to sealing body 3 of silver paste 6 (paste material).

Here, the structure of QFN 12 of Embodiment 2 is explained. Here, only the point of difference of QFN 12 from QFN 5 of Embodiment 1 is explained.

QFN 12 of the Embodiment 2 shown in FIG. 10-FIG. 15 is small, and is a semiconductor package of small tab structure and a tab exposure type like QFN 5 of Embodiment 1. Step part 1e is formed in the edge part of chip supporting surface 1c of tab 1b by half etching processing in QFN 12 as well as QFN 5. This step part 1e is formed in the part except suspension lead 1i in the edge part of chip supporting surface 1c of tab 1b in the position lower than chip supporting surface 1c, as shown in FIG. 16.

As shown in the section C of FIG. 14, by step part 1e being formed, silver paste 6 overflowed and protruded from chip supporting surface 1c is stopped in the part which goes to step part 1e, and silver paste 6 does not flow into back surface 3a of sealing body 3.

The feature of QFN 12 of Embodiment 2 is that protruding portion 1k projecting from step part 1e is formed in step part 1e of tab 1b toward semiconductor chip 2.

This protruding portion 1k heightens the anchor effect of step part 1e of tab 1b, and sealing body 3, increases both adhesions, and suppresses peeling of step part 1e of tab 1b, and sealing body 3.

It is formed by the method of leaving the part of protruding portion 1k by shaving the circumference of protruding portion 1k by half etching in the state where the mask has been arranged in the part of this protruding portion 1k at the time of the half etching processing of step part 1e of tab 1b. Therefore, the height of protruding portion 1k is the same height as the height of chip supporting surface 1c of tab 1b.

Near the point has become broader than near the central part, and protruding portion 1k constitutes inverted trapezoid form, as shown in FIG. 14. That is, since the etching rate is larger than near the tip where the mask has been arranged at the time of half etching, near the center of the height direction of protruding portion 1k is shaved more than near the tip, and the inverted trapezoid form is the result. When the form near the tip of protruding portion 1k is inverted trapezoid form, an anchor effect can be heightened further.

In QFN 12, as shown in FIG. 16, chip supporting surface 1c of tab 1b accomplishes a quadrangle, and protruding portion 1k is formed in the central part of step part 1e corresponding to one side of quadrangular tab 1b. It is formed in every one step part 1e corresponding to one side of quadrangular tab 1b.

However, when improving only an anchor effect, it is more desirable to form more than one in step part 1e corresponding to one side of quadrangular tab 1b as the number of protruding portions 1k. However, in order not to hamper the mobility of resin 8 (refer to FIG. 24) for sealing, as shown in FIG. 16, it is preferred for one to be formed near the central part of each step part 1e corresponding to one side.

The distance of protruding portion 1k and tab 1b needs about 0.2 mm, for example, in order to make resin 8 for sealing, or an etching solution go through-easy, when the board thickness of a lead frame is 0.2 mm for example.

Then, FIG. 17 is a case where the modification of protruding portion 1k is shown and long and slender protruding portion 1k is formed in step part 1e of each side. Between protruding portion 1k and tab 1b, only the distance which fully lets resin 8 for sealing and an etching solution pass may be unable to be maintained. Then, scooping parts (hollow part) 1m which were able to be scooped out in the direction which keeps away from protruding portion 1k of each side may be formed on each side of chip supporting surface 1c.

Thus, by forming scooping part 1m in chip supporting surface 1c, even if it forms long and slender protruding portion 1k (hollow to the horizontal direction of tab 1b), while it becomes possible to fully let resin 8 for sealing and an etching solution pass, the anchor effect of tab 1b and sealing body 3 can be heightened more.

Next, the manufacturing method of QFN 12 (semiconductor device) of Embodiment 2 is explained along the assembly flow diagram shown in FIG. 18.

First, a wafer is supplied and wafer BG (backsurface grinding) shown in Step S1 of FIG. 18 is performed. That is, back surface polish of a wafer is performed and a wafer is made into desired thickness.

Then, wafer mounting which fixes a wafer to a dicing jig and which is shown in Step S2 is performed.

Then, dicing shown in Step S3 is performed. That is, by dicing, a wafer is cut and each semiconductor chip 2 is individually separated.

Next, lead frame 1 with a tape (lead frame) shown in FIG. 19 and FIG. 20 is prepared. This lead frame 1 with a tape is supplied, silver paste 6 is supplied further, and die bonding shown in Step S4 is performed. The lead frame used for the assembly of QFN 12 of Embodiment 2 is lead frame 1 with a tape.

That is, since QFN 12 is assembled by performing resin molding according to a MAP method, as mentioned above, lead frame 1 with a tape by which the resin burr is not formed in the back surface is side of a lead frame is used.

Lead frame 1 with a tape sticks tape 11 which comprises base material 11a and adhesive layer 11b as shown in FIG. 21 on the back surface 1s of the frame body 1t which is a lead frame of the metal which comprises a copper alloy, etc., for example. That is, tape 11 which has adhesive layer 11b is stuck on the back surface 1s of frame body 1t. As shown in FIG. 19, in the matrix arrayed, a plurality of device regions (semiconductor device formation regions) in adjoin, and are formed in the main surface (surface at the side of chip mounting) of lead frame 1 with a tape.

Tab 1b with which step part 1e with low height from chip supporting surface 1c was formed in the edge part of chip supporting surface 1c, a plurality of leads 1a arranged around tab 1b, and protruding portion 1k formed in step part 1e are formed in each device region 1n. A plurality of guide holes 1r are formed in frame part 1p of a direction parallel to the long-side direction of the frame body 1t of lead frame 1 with a tape, and further slit 1q is formed between the aggregates of a plurality of device regions 1n.

At the die-bonding step shown in Step S4, silver paste 6 is first applied on chip supporting surface 1c of tab 1b. Tab 1b is the so-called small tab with small contour size from back surface 2c of semiconductor chip 2. As shown in FIG. 22, silver paste 6 is first applied to the central part of tab 1b. Then, semiconductor chip 2 is joined via silver paste 6 on chip supporting surface 1c of tab 1b. When semiconductor chip 2 is mounted on chip supporting surface 1c in this case, as shown in FIG. 23, silver paste 6 will continue almost all over the chip supporting surface 1c, and will be in a wet and extending state. Even if silver paste 6 is fully applied and silver paste 6 protrudes and hangs down from chip supporting surface 1c, since step part 1e is formed in the edge part of tab 1b, silver paste 6 which hangs down can be caught. It can be prevented that silver paste 6 flows into back surface 3a of sealing body 3.

This completes a die-bonding step.

Then, the bake shown in Step S5 is performed, and silver paste 6 is heat-treated.

Then, wire bonding shown in Step S6 is performed. Here, wire 4 is supplied, and as shown in FIG. 14, each of a plurality of pads 2a of semiconductor chip 2 and each wire connection surface 1h of lead 1a corresponding to this are electrically connected with wires 4, such as gold wires.

Then, assembly visual inspection shown in Step S7 is conducted.

Then, the resin molding shown in Step S8 is performed. Here, as shown in FIG. 24 and FIG. 25, where a plurality of device regions (semiconductor device formation regions) in are covered by one cavity 9c of resin-molding metallic mold 9, resin 8 for sealing is injected into cavity 9c.

In the case, where tape 11 which has adhesive layer 11b is stuck on the back surface 1s of frame body 1t (lead frame), as shown in FIG. 24, this lead frame 1 with a tape is arranged on metallic mold surface 9d of lower die 9b. Then, as a plurality of device regions in shown in FIG. 25 are covered by cavity 9c of upper die 9a, upper die 9a and lower die 9b of resin-molding metallic mold 9 are clamped, and resin 8 for sealing is injected into cavity 9c in this state.

By injection of resin 8 for sealing, as shown in FIG. 14, resin 8 for sealing is circulated between semiconductor chip 2, and step part 1e of tab 1b. The resin seal of semiconductor chip 2 and a plurality of wires 4 is done so that the back surface 1d of the opposite side of chip supporting surface 1c of tab 1b, and each of mounting surface 1g (part) of a plurality of leads 1a may be exposed. By this, as shown in FIG. 26 and FIG. 27, batch molded body 10 is formed.

Then, tape peeling of Step S9 shown in FIG. 18 is performed. Here, as shown in FIG. 28, from the back surface 1s of the frame body 1t of lead frame 1 with a tape, tape 11 is pulled and peeled.

At this time, protruding portion 1k projecting toward semiconductor chip 2 is formed in step part 1e of tab 1b in QFN 12. The anchor effect of step part 1e of tab 1b and sealing body 3 is heightened by this protruding portion 1k. That is, since the adhesion of step part 1e of tab 1b and sealing body 3 is increased, when peeling tape 11, even if tab 1b is pulled in the direction which drops out of sealing body 3, peeling of step part 1e of tab 1b and sealing body 3 can be suppressed.

By this, it can be suppressed that a clearance is formed between tab 1b and sealing body 3 at the time of tape peeling.

Then, the tape stripped plane cleaning shown in Step S10 is performed. That is, the back surface 1s of the frame body 1t of lead frame 1 with a tape is cleaned. Here, the remainder of adhesive layer 11b of tape 11 is removed using organic system solvents, such as acetone, for example. In the case, in QFN 12 of Embodiment 2, protruding portion 1k is formed in step part 1e of tab 1b, and the clearance has become not easily formed between tab 1b and sealing body 3 by the anchor effect.

Therefore, even if chemical solutions, such as an organic system solvent are used, it is difficult for this chemical solution to enter between tab 1b and sealing body 3. As a result, what chemical solutions (impurities), such as the organic system solvent, ooze out (flow out) at a later processing step can be suppressed.

Then, mold bake shown in Step S11 is performed. Here, sealing body 3 is cured by heat treatment.

Then, exterior plating formation shown in Step S12 is performed. Here, exterior plating 7 is formed in the back surface 1d of tab 1b and each mounting surface 1g of a plurality of leads 1a which are exposed from batch molded body 10. Exterior plating 7 is Pb free solder, such as tin-bismuth, for example. In the assembly of QFN 12, protruding portion 1k was formed in step part 1e of tab 1b, and the clearance has become not easily formed between tab 1b and sealing body 3 by an anchor effect. As a result, since impurities, such as a chemical solution, also have difficulty entering between tab 1b and sealing body 3, it can be suppressed that impurities, such as a chemical solution, ooze out at the exterior plating forming step.

Therefore, in the assembly of QFN 12 of Embodiment 2, since an impurity cannot enter easily between step part 1e and sealing body 3, it can be suppressed that the impurity oozes out at the exterior plating forming step, and making exterior plating 7 discolor. It can also be suppressed that exterior plating 7 peels when an impurity oozes out.

Then, the laser mark shown in Step S13 is performed, and a desired mark is attached to the front surface of sealing body 3.

Then, package dicing shown in Step S14 is performed. Here, batch molded body 10 and a lead frame (frame body 1t) are cut, and they are individually separated to each QFN 12.

Then, the DC test of Step S15 and visual inspection of Step S16 are conducted, and it becomes assembly completion of QFN 12.

According to QFN 12 and its manufacturing method of Embodiment 2, an anchor effect can raise the adhesion of sealing body 3 and tab 1b by forming in step part 1e of tab 1b protruding portion 1k projecting toward semiconductor chip 2.

Hereby, peeling at step part 1e of tab 1b can be suppressed. That is, impurities, such as a chemical solution, have difficulty entering into an interface with sealing body 3 of tab 1b by making the clearance between tab 1b and sealing body 3 as small as possible. Therefore, discoloration of exterior plating 7 by the outflow of the impurity can be suppressed. Peeling of exterior plating 7 by the outflow of the impurity can also be suppressed.

As a result, the quality and reliability of QFN 12 (semiconductor device) can be improved.

Since it is the same as that of Embodiment 1 about the other effects acquired by QFN 12 and its manufacturing method of Embodiment 2, the duplicate explanation is omitted.

In the foregoing, the present invention accomplished by the present inventors is concretely explained based on the above embodiments, but the present invention is not limited by the above embodiments, but variations and modifications may be made, of course, in various ways in the limit that does not deviate from the gist of the invention.

For example, the Embodiment 2 explained the case where the height of protruding portion 1k formed in step part 1e of tab 1b was the same height as chip supporting surface 1c of tab 1b. However, the height of protruding portion 1k may be lower than chip supporting surface 1c, as long as it is a height which can acquire an anchor effect with sealing body 3.

The present invention is suitable for a small electronic device and its manufacturing technology.

What is claimed is:

1. A semiconductor device, comprising:
   (a) a plurality of leads each having a first upper surface, a first step part formed at an end part of the first upper surface, and a first lower surface opposite to the first upper surface,
   where the first step part has a second upper surface arranged on the same side of the leads as the first upper surface, and a second lower surface opposite to the second upper surface;
   (b) a chip mounting part arranged between the leads adjacent to one another in a cross-section view,
   where the chip mounting part has a third upper surface arranged on the same side as the first upper surface, a second step part formed at a peripheral part of the third upper surface in a plan view, and a third lower surface opposite to the third upper surface, and
   where the second step part has a fourth upper surface arranged on the same side as the third upper surface, and a fourth lower surface opposite to the fourth upper surface;
   (c) a semiconductor chip having a front surface, a plurality of electrodes formed on the front surface, and a rear surface opposite to the front surface, and mounted over the third upper surface of the chip mounting part via a paste material such that both the second upper surface of the first step part located between the first upper surface and the first lower surface in the cross-section view and the fourth upper surface of the second step part located between the third upper surface and the third lower surface in the cross-section view are overlapped by the rear surface of the semiconductor chip in a plan view;
   (d) a plurality of wires electrically connecting the electrodes with the leads, respectively,
   wherein each of the wires is connected to the first upper surface of respective ones of the leads; and
   (e) a sealing body sealing the semiconductor chip and the wires such that the first lower surface of each of the leads and the third lower surface of the chip mounting part are exposed from the sealing body,
   wherein the first step part of each of the leads faces the chip mounting part and the second step part is formed at a peripheral part of the third upper surface such that the first step part and the second step part face each other,
   wherein the second upper surface of the first step part and the fourth upper surface of the second step part are disposed at the same height,
   wherein a width of the first upper surface is larger than a width of the first lower surface, the width of the first upper surface and the width of the first lower surface being defined in a direction parallel to an edge of the sealing body in the plan view, and
   wherein a size of the chip mounting part is smaller than that of the semiconductor chip in the plan view.

2. A semiconductor device according to claim 1, wherein the third upper of the chip mounting part and the first upper surface of each of the leads are at the same height.

3. A semiconductor device according to claim 1, wherein the paste material is arranged all over the third upper surface of the chip mounting part.

* * * * *